US012191119B2

(12) United States Patent
Sasaki (10) Patent No.: US 12,191,119 B2
(45) Date of Patent: Jan. 7, 2025

(54) SUBSTRATE PROCESSING APPARATUS AND GAS SWITCHING METHOD FOR SUBSTRATE PROCESSING APPARATUS

(71) Applicant: TOKYO ELECTRON LIMITED, Tokyo (JP)

(72) Inventor: Nobutaka Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 521 days.

(21) Appl. No.: 17/395,529

(22) Filed: Aug. 6, 2021

(65) Prior Publication Data

US 2022/0059323 A1 Feb. 24, 2022

(30) Foreign Application Priority Data

Aug. 18, 2020 (JP) .................... 2020-138068

(51) Int. Cl.
*H01J 37/32* (2006.01)

(52) U.S. Cl.
CPC .. *H01J 37/32449* (2013.01); *H01J 37/32834* (2013.01); *H01J 2237/24585* (2013.01)

(58) Field of Classification Search
CPC ........... H01J 37/32449; H01J 37/32633; H01J 37/32816; H01J 37/32834; H01J 2237/24585
See application file for complete search history.

(56) References Cited

U.S. PATENT DOCUMENTS

| 5,391,252 A * | 2/1995 | Taylor ............... H01J 37/32082 156/345.26 |
| 10,249,478 B2 * | 4/2019 | Sasaki ............... H01J 37/32651 |
| 2005/0133059 A1 * | 6/2005 | Chen ................... C23C 16/4405 134/1.1 |
| 2005/0176258 A1 * | 8/2005 | Hirose .............. H01L 21/67253 438/714 |
| 2005/0189074 A1 * | 9/2005 | Kasai .................. H01L 21/6831 156/345.33 |
| 2006/0086259 A1 * | 4/2006 | Okajo ............... H01J 37/32935 99/342 |

(Continued)

FOREIGN PATENT DOCUMENTS

| JP | 2015-173240 A | 10/2015 |
| WO | 2014/046083 A1 | 3/2014 |

*Primary Examiner* — Benjamin Kendall
(74) *Attorney, Agent, or Firm* — Nath, Goldberg & Meyer; Jerald L. Meyer; Tanya E. Harkins (57) ABSTRACT

A substrate processing apparatus includes: a processing chamber configured to execute a processing on a substrate by an introduced gas; an exhaust chamber configured to exhaust a gas existing in the processing chamber; a partition plate having a plurality of gas passing holes for bringing the processing chamber and the exhaust chamber into communication with each other therethrough; a measuring instrument configured to measure a state in the processing chamber; a first pipe configured to connect the processing chamber and the measuring instrument; a second pipe configured to bring the exhaust chamber and the measuring instrument into communication with each other therethrough via a first valve; and a controller, wherein the controller is configured to control the substrate processing apparatus so as to control the first valve.

16 Claims, 8 Drawing Sheets

(56) References Cited

U.S. PATENT DOCUMENTS

| | | | |
|---|---|---|---|
| 2008/0176412 A1* | 7/2008 | Komeda | C23C 16/4412 |
| | | | 118/712 |
| 2012/0094483 A1* | 4/2012 | Komiya | C23C 16/45502 |
| | | | 438/653 |
| 2017/0268952 A1* | 9/2017 | Kikuchi | G01L 15/00 |

* cited by examiner

SUBSTRATE PROCESSING APPARATUS AND GAS SWITCHING METHOD FOR SUBSTRATE PROCESSING APPARATUS

CROSS-REFERENCE TO RELATED APPLICATION

This application is based upon and claims the benefit of priority from Japanese Patent Application No. 2020-138068, filed on Aug. 18, 2020, the entire contents of which are incorporated herein by reference.

TECHNICAL FIELD

The present disclosure relates to a substrate processing apparatus and a gas switching method for a substrate processing apparatus.

BACKGROUND

Conventionally, there is known a substrate processing apparatus that performs a desired process on a substrate with an introduced gas. The substrate processing apparatus is provided with a processing container which includes a processing chamber in which a substrate is placed and into which a gas is introduced, and an exhaust chamber for exhausting the gas existing in the processing chamber. In the substrate processing apparatus, when performing the desired process, an internal pressure of the processing container is measured and controlled so as to meet process conditions. Further, as the desired process, for example, there is known a process in which a step of removing excess deposits, a step of forming a protective film on a mask and an etching step are repeatedly performed while replacing a processing gas. In addition, for example, there is known an ALE (Atomic Layer Etching) process in which an etchant deposition step using a CF gas and an activation step using ions of a noble gas are repeated.

PRIOR ART DOCUMENT

Patent Document

Patent Document 1: international Publication No. WO 2014/046083
Patent Document 2: Japanese Laid-Open Patent Publication No. 2015-173240

SUMMARY

According to one embodiment of the present disclosure, there is provided a substrate processing apparatus includes: a processing chamber configured to execute a processing on a substrate by an introduced gas; an exhaust chamber configured to exhaust a gas existing in the processing chamber; a partition plate having a plurality of gas passing holes for bringing the processing chamber and the exhaust chamber into communication with each other therethrough; a measuring instrument configured to measure a state in the processing chamber; a first pipe configured to connect the processing chamber and the measuring instrument; a second pipe configured to bring the exhaust chamber and the measuring instrument into communication with each other therethrough via a first valve; and a controller, wherein the controller is configured to control the substrate processing apparatus so as to control the first valve.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a substrate processing apparatus disclosed herein and a gas switching method for the substrate processing apparatus will be described in detail with reference to the drawings. The technology disclosed herein is not limited by the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

When a processing gas is replaced at the time of switching a plurality of steps, the time required for replacing the processing gas may affect the throughput. Insufficient gas replacement may cause process fluctuations and particle generation due to mixing of gases. A measuring instrument, for example, a pressure gauge for measuring an internal pressure of a chamber during process execution reduces the conductance of the connection portion of a pipe with the chamber because the pipe has a dead end and prevents the inflow of active species from plasma. If the pipe has a dead end and the conductance of the connection portion of the pipe with the chamber is low, it may hinder the gas replacement. That is, a portion of the gas before replacement tends to remain inside the pressure gauge, which causes a delay in pressure control. Therefore, the gas inside the measuring instrument such as a pressure gauge or the like needs to be replaced at high speed.

First Embodiment

[Configuration of Substrate Processing Apparatus]

Figure 1:
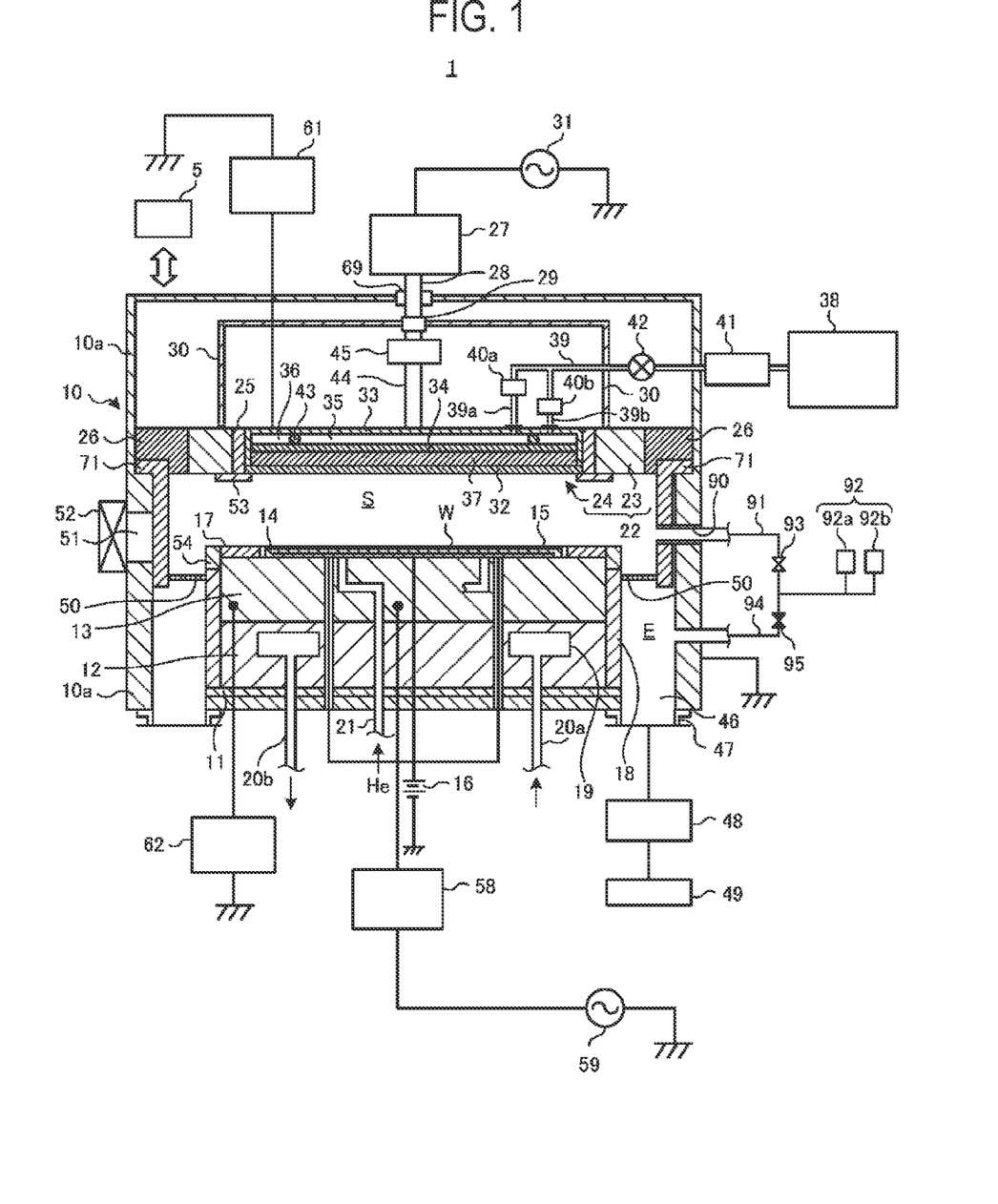
FIG. 1 is a diagram showing an example of a substrate processing apparatus according to a first embodiment of the present disclosure.

FIG. 1 is a diagram showing an example of a substrate processing apparatus according to a first embodiment of the present disclosure. In the following, a case in which the substrate processing apparatus is a plasma processing apparatus will be described by way of example.

However, the present disclosure is not limited thereto.

In FIG. 1, the plasma processing apparatus 1 is configured as a capacitively coupled parallel plate plasma etching apparatus. For example, the plasma processing apparatus 1 includes a cylindrical chamber (processing chamber) 10 made of aluminum whose surface is anodized. The chamber 10 is grounded for security. However, the plasma processing apparatus 1 is not limited to the capacitively coupled parallel plate plasma etching apparatus, and may be any type of plasma processing apparatus using inductively coupled plasma (ICP), microwave plasma, magnetron plasma or the like.

At a bottom portion of the chamber 10, a columnar susceptor support table 12 is arranged via an insulating plate 11 made of, for example, ceramic or the like. A conductive susceptor 13 made of, for example, aluminum or the like is arranged on the susceptor support table 12. The susceptor 13 has a configuration that functions as a lower electrode, and places a substrate to be etched, for example, a wafer W which is a semiconductor wafer.

An electrostatic chuck (ESC) 14 configured to hold the wafer W by an electrostatic attraction force is arranged on an upper surface of the susceptor 13. The electrostatic chuck 14 includes an electrode plate 15 made of a conductive film, and a pair of insulating layers configured to sandwich the electrode plate 15 therebetween and made of, for example, a dielectric material such as $Y_2O_3$, $Al_2O_3$, AlN or the like. A direct current (DC) power supply 16 is electrically connected to the electrode plate 15 via a connection terminal. The electrostatic chuck 14 attracts and holds the wafer W by a Coulomb force or a Johnson-Rahbek force generated by a DC voltage applied from the DC power supply 16.

Further, a plurality of (e.g., three) pusher pins as lift pins that can protrude from the upper surface of the electrostatic chuck 14 are arranged on the upper surface of the electrostatic chuck 14 where the wafer W is attracted and held. These pusher pins are connected to a motor (not shown) via ball screws (not shown) and are configured to protrude freely from the upper surface of the electrostatic chuck 14 by a rotational motion of the motor converted into a linear motion by the ball screws. As a result, the pusher pins move vertically through the electrostatic chuck 14 and the susceptor 13. When the electrostatic chuck 14 attracts and holds the wafer W to etch the wafer W, the pusher pins are accommodated in the electrostatic chuck 14. When the etched wafer W is unloaded from a plasma generation space 5, the pusher pins protrude from the electrostatic chuck 14 to separate the wafer W from the electrostatic chuck 14 and lift the wafer W upward.

An edge ring 17 made of, for example, silicon (Si) to improve etching uniformity is arranged on an outer periphery of the upper surface of the susceptor 13, and a cover ring 54 for protecting the side portion of the edge ring 17 is arranged around the edge ring 17. Further, the side surfaces of the susceptor 13 and the susceptor support table 12 are covered with a cylindrical member 18 made of, for example, quartz ($SiO_2$).

Inside the susceptor support table 12, for example, a refrigerant chamber 19 extending in the circumferential direction is arranged. A refrigerant, for example, cooling water, having a predetermined temperature is supplied in a circulation manner to the refrigerant chamber 19 from an external chiller unit (not shown) via pipes 20a and 20b, The refrigerant chamber 19 controls a processing temperature of the wafer W on the susceptor 13 according to the temperature of the refrigerant.

Further, by supplying a heat transfer gas, for example, a helium (He) gas, from a heat transfer gas supply mechanism (not shown) to between the upper surface of the electrostatic chuck 14 and a back surface of the wafer W via a gas supply line 21, the heat transfer between wafer W and the susceptor 13 is efficiently and uniformly controlled.

Above the susceptor 13, an upper electrode 22 is arranged so as to be parallel to and face the susceptor 13. In this case, a space formed between the susceptor 13 and the upper electrode 22 functions as the plasma generation space S (internal space of the processing chamber). The upper electrode 22 includes an annular (or donut-shaped) outer upper electrode 23 arranged so as to face the susceptor 13 at a predetermined distance, and a disk-shaped inner upper electrode 24 arranged radially inward of the outer upper electrode 23 and insulated from the outer upper electrode 23. In addition, regarding plasma generation, the outer upper electrode 23 is the main electrode, and the inner upper electrode 24 is the auxiliary electrode.

An annular gap of, for example, 0.25 to 2.0 mm is formed between the outer upper electrode 23 and the inner upper electrode 24, and a dielectric body 25 made of, for example, quartz is arranged in the gap. A ceramic body may be arranged in the gap instead of the dielectric body 25 made of quartz. A capacitor is formed by sandwiching the dielectric body 25 between the outer upper electrode 23 and the inner upper electrode 24. A capacitance C of the capacitor is selected or adjusted to a desired value according to a size of the gap and a dielectric constant of the dielectric body 25. In addition, an annular insulating shield member 26 made of, for example, alumina ($Al_2O_3$) or yttria ($Y_2O_3$) is airtightly arranged between the outer upper electrode 23 and the side wall of the chamber 10.

The outer upper electrode 23 is preferably made of a low resistance conductor or semiconductor having low Joule heat, for example, silicon. An upper radio-frequency power supply 31 is electrically connected to the outer upper electrode 23 via an upper matcher 27, an upper power feeding rod 28, a connector 29 and a power feeding cylinder 30. The upper matcher 27 matches a load impedance with an internal for output) impedance of the upper radio-frequency power supply 31, and functions such that when plasma is generated inside the chamber 10, the output impedance of the upper radio-frequency power supply 31 and the load impedance coincide apparently with each other. In addition, an output terminal of the upper matcher 27 is connected to an upper end of the upper power feeding rod 28.

The power feeding cylinder 30 is made of a substantially cylindrical or conical conductive plate, for example, an aluminum plate or a copper plate. A lower end of the power feeding cylinder 30 is connected to the outer upper electrode 23 continuously in the circumferential direction, and an upper end thereof is electrically connected to a lower end portion of the upper power feeding rod 28 via a connector 29. On the outer side of the power feeding cylinder 30, the side wall of the chamber 10 extends upward beyond a height position of the upper electrode 22 to form a cylindrical ground conductor 10a. An upper end portion of the cylindrical ground conductor 10a is electrically insulated from the upper power feeding rod 28 by a cylindrical insulating member 69. With this configuration, in a load circuit seen from the connector 29, the power feeding cylinder 30, the outer upper electrode 23 and the ground conductor 10a form a coaxial line in which the power feeding cylinder 30 and the outer upper electrode 23 are used as a waveguide.

The inner upper electrode 24 includes an upper electrode plate 32 and an electrode support 33. The upper electrode plate 32 is made of a semiconductor material such as silicon, silicon carbide (SiC) or the like, and has a large number of electrode plate gas passing holes (first gas passing holes) (not shown). The electrode support 33 is a conductive member that detachably supports the upper electrode plate 32, and is made of, for example, aluminum whose surface is anodized. The upper electrode plate 32 is fastened to the electrode support 33 by bolts (not shown). Heads of the bolts are protected by an annular shield ring 53 located below the upper electrode plate 32.

In the upper electrode plate 32, each of the electrode plate gas passing holes penetrates the upper electrode plate 32. Inside the electrode support 33, there is formed a buffer chamber into which a processing gas described later is introduced. The buffer chamber includes two buffer chambers divided by an annular partition member 43 made of, for example, an O-ring, namely a central buffer chamber 35 and a peripheral buffer chamber 36. A lower portion of the buffer chamber is opened. Below the electrode support 33, there is arranged a cooling plate (hereinafter referred to as "C/P") 34 (intermediate member) that closes the lower portion of the buffer chamber. The C/P 34 is made of aluminum whose surface is anodized, and has a large number of C/P gas passing holes (second gas passing holes) (not shown). In the C/P 34, each of the C/P gas passing holes penetrates the C/P 34.

Further, a spacer 37 made of a semiconductor material such as silicon, silicon carbide or the like is interposed between the upper electrode plate 32 and the C/P 34. The spacer 37 is a disk-shaped member. The spacer 37 includes a large number of upper surface annular grooves formed concentrically with the disk-shaped member on a surface (hereinafter simply referred to as "upper surface") of the spacer 37 facing the C/P 34, and a large number of spacer gas passing holes (third gas passing holes) formed to penetrate the spacer 37 and opened at the bottom portions of the upper surface annular grooves.

The inner upper electrode 24 supplies the processing gas introduced into the buffer chamber from a processing gas source 38, which will be described later, to the plasma generation space S via the C/P gas passing holes of the C/P 34, the spacer gas passing holes of the spacer 37 and the electrode plate gas passing holes of the upper electrode plate 32. In this case, the central buffer chamber 35, and the C/P gas passing holes, the spacer gas passing holes and the electrode plate gas passing holes existing below the central buffer chamber 35 constitute a central shower head (central processing gas supply path). Further, the peripheral buffer chamber 36, and the C/P gas passing holes, the spacer gas passing holes and the electrode plate gas passing holes existing below the peripheral buffer chamber 36 constitute a peripheral shower head (peripheral processing gas supply path).

Further, as shown in FIG. 1, a processing gas source 38 is arranged outside the chamber 10. The processing gas source 38 supplies a processing gas to the central buffer chamber 35 and the peripheral buffer chamber 36 at a desired flow rate ratio. Specifically, the gas supply pipe 39 extending from the processing gas source 38 is branched on the way into two branch pipes 39a and 39b, which are connected to the central buffer chamber 35 and the peripheral buffer chamber 36, respectively. The branch pipes 39a and 39b have flow rate control valves 40a and 40b (flow rate control devices), respectively. Conductances of the flow paths from the processing gas source 38 to the central buffer chamber 35 and the peripheral buffer chamber 36 are set to be equal to each other. Therefore, the flow rate ratio of the processing gases supplied to the central buffer chamber 35 and the peripheral buffer chamber 36 can be arbitrarily adjusted by controlling the flow rate control valves 40a and 40b, In addition, a mass flow controller (MFC) 41 and an opening/closing valve 42 are arranged in the gas supply pipe 39.

With the above configuration, the plasma processing apparatus 1 arbitrarily adjusts a ratio (FC/FE) of a flow rate FC of the gas discharged from the central shower head to a flow rate FE of the gas discharged from peripheral shower head by adjusting the flow rate ratio of the processing gases to be introduced into the central buffer chamber 35 and the peripheral buffer chamber 36. It may also be possible to individually adjust the flow rates per unit area of the processing gases discharged from the central shower head and the peripheral shower head. Further, by arranging two processing gas sources corresponding to the branch pipes 39a and 39b, it is possible to independently or separately set the gas types or gas mixing ratios of the processing gases discharged from the central shower head and the peripheral shower head. However, the present disclosure is not limited thereto. The plasma processing apparatus 1 may not adjust the ratio of the flow rate FC of the gas discharged from the central shower head to the flow rate FE of the gas discharged from peripheral shower head.

Further, the upper radio-frequency power supply 31 is electrically connected to the electrode support 33 of the inner upper electrode 24 via the upper matcher 27, the upper power feeding rod 28, the connector 29 and the upper power feeding cylinder 44. A variable capacitor 45 capable of variably adjusting the capacitance is arranged in the upper power feeding cylinder 44. The outer upper electrode 23 and the inner upper electrode 24 may also be provided with a refrigerant chamber or a cooling jacket (not shown) to control the temperatures of the electrodes by the refrigerant supplied from the external chiller unit (not shown).

An exhaust port 46 is provided at the bottom portion of the chamber 10. An automatic pressure control valve (hereinafter referred to as "APC valve") 48, which is a variable butterfly valve, and a turbo molecular pump (hereinafter referred to as "TMP") 49 are connected to the exhaust port 46 via an exhaust manifold 47. The APC valve 48 and TMP 49 cooperates to depressurize the plasma generation space S inside the chamber 10 to a desired degree of vacuum. Further, an annular partition plate 50 having a plurality of gas passing holes is arranged between the exhaust port 46 and the plasma generation space S so as to surround the susceptor 13. The partition plate 50 prevents leakage of plasma from the plasma generation space S to the exhaust port 46. The partition plate 50 has a plurality of gas passing holes that bring the plasma generation space S (processing chamber) and the exhaust space E (exhaust chamber) into communication with each other. The partition plate 50 is an example of an exhaust ring. That is, the plasma generation space S is an example of the processing chamber, and an exhaust space E extending from the partition plate 50 to the exhaust port 46 is an example of the exhaust chamber.

Further, an opening 51 for loading and unloading the wafer W therethrough is provided in an outer side wall of the chamber 10, and a gate valve 52 for opening and closing the opening 51 is arranged. A deposit shield 71 is detachably provided inside the chamber 10 along an inner wall of the chamber 10. The deposit shield 71 is provided with an openable/closable shutter at a position corresponding to the opening 51 of the chamber 10. FIG. 1 shows a state in which the shutter is closed. A lower portion of the deposit shield 71 is connected to the partition plate 50. The deposit shield 71 may be formed by, for example, coating an aluminum material with ceramic such as $Y_2O_3$ or the like.

The wafer W is loaded and unloaded by opening and closing the gate valve 52. By closing the shutter of the deposit shield 71 after the loading and unloading is completed and the gate valve 52 is closed, the opening 51 of the chamber 10 and the plasma generation space S are shut off. In addition, the deposit shield 71 has a through-hole for connecting a sleeve 90 described later.

Further, in the plasma processing apparatus 1, a lower radio-frequency power supply (first radio-frequency power supply) 59 is electrically connected to the susceptor 13 as a lower electrode via a lower matcher 58. The lower matcher 58 is configured to match a load impedance with an internal (or output) impedance of the lower radio-frequency power supply 59, and functions such that when plasma is generated inside the plasma generation space S of the chamber 10, the internal impedance of the lower radio-frequency power supply 59 and the load impedance coincide apparently with each other. In addition, another second lower radio-frequency power supply (second radio-frequency power supply) may be connected to the lower electrode.

Further, in the plasma processing apparatus 1, a low-pass filter (LPF) 61 that passes the radio-frequency power from the lower radio-frequency power supply 59 to the ground without passing the radio-frequency power from the upper radio-frequency power supply 31 to the ground is electrically connected to the inner upper electrode 24. The LPF 61 is preferably composed of an LR filter or an LC filter. However, since it is possible for one conductor to apply a sufficiently large reactance to the radio-frequency power from the upper radio-frequency power supply 31, one conductor may be electrically connected to the inner upper electrode 24 instead of the LR filter or the LC filter. Meanwhile, a high-pass filter (HPF) 62 for passing the radio-frequency power from the upper radio-frequency power supply 31 to the ground is electrically connected to the susceptor 13.

The sleeve 90 is provided on the side wall of the chamber 10. The sleeve 90 is a hollow relay member, and is fitted into the through-hole provided in the deposit shield 71. The sleeve 90 penetrates the side wall of the chamber 10, and brings the plasma generation space S, which is a processing chamber, into communication with a pipe 91. The pipe 91 is a pipe connected to the sleeve 90 on the side wall of the chamber 10 to connect the sleeve 90 and the capacitance manometers 92a and 92b. The pipe 91 is an example of a first pipe. In the following description, the capacitance manometers 92a and 92b are also collectively referred to as capacitance manometer 92. A plurality of sleeves 90 and a plurality of capacitance manometers 92 may be provided.

The capacitance manometer 92a can measure a pressure in the range of 0 mT to 10 T (0 Pa to 1,333 Pa). The capacitance manometer 92b can measure a pressure in the range of 0 mT to 250 mT (0 Pa to 33.3 Pa). In the present embodiment, two capacitance manometers 92a and 92b having different measurement ranges are installed. However, the pressure gauge is not limited thereto. One or three or more capacitance manometers 92 may be installed. The pressure gauge is not limited to the capacitance manometer 92. A Pirani gauge or the like may be used. In addition, the pipe 91 is provided with a valve 93 for protecting the capacitance manometer 92 when the chamber 10 is exposed to the atmosphere.

A pipe 94 connects the exhaust space E (exhaust chamber) of the chamber 10 and the capacitance manometer 92 via a valve 95. The pipe 94 is an example of a second pipe. One end of the pipe 94 is connected to an intermediate portion between the valve 93 of the pipe 91 and the capacitance manometer 92. The valve 95 is opened when the processing conditions in the plasma generation space S are switched, and is closed after a predetermined period of time. The valve 95 is an example of a first valve.

The controller 5 includes a memory, a processor and an input/output interface. The processor of the controller 5 controls each part of the plasma processing apparatus 1 via the input/output interface of the controller 5 by reading and executing a program stored in the memory of the controller 5.

Subsequently, when etching is performed in the plasma processing apparatus 1, the gate valve 52 and the shutter are first opened, and the wafer W to be processed is loaded into the chamber 10 and placed on the susceptor 13. Then, a processing gas, for example, a mixed gas of a $C_4F_8$ gas and an argon (Ar) gas is introduced into the central buffer chamber 35 and the peripheral buffer chamber 36 from the processing gas source 38 at a predetermined flow rate and a predetermined flow rate ratio. Further, the pressure of the plasma generation space S of the chamber 10 is set by the APC valve 48 and the TMP 49 to a value suitable for the etching, for example, a value in the range of several m Torr to 1 Torr.

Further, the upper radio-frequency power supply 31 applies radio-frequency power for plasma generation to the upper electrode 22 (the outer upper electrode 23 and the inner upper electrode 24) at a predetermined power, and the lower radio-frequency power supply 59 applies a predetermined radio-frequency power for bias to the lower electrode of the susceptor 13 at a predetermined power. In addition, a DC voltage is applied from the DC power supply 16 to the electrode plate 15 of the electrostatic chuck 14, and the wafer W is electrostatically attracted to the susceptor 13.

Then, plasma is generated in the plasma generation space S by the processing gas discharged from the shower head, and a surface to be processed of the wafer W is physically or chemically etched by radicals and ions generated at this time.

In the plasma processing apparatus 1, the plasma is caused to have a high density in a preferable dissociated state by applying a radio-frequency in a radio-frequency region (a frequency region in which ions cannot move) to the upper electrode 22. In addition, high-density plasma can be formed even under lower pressure conditions.

On the other hand, in the upper electrode 22, the outer upper electrode 23 is used as the main radio-frequency electrode for plasma generation and the inner upper electrode 24 is used as the sub radio-frequency electrode for plasma generation, thereby making it possible to adjust an intensity ratio of the electric fields applied to the electrons directly under the upper electrode 22 by the upper radio-frequency power supply 31 and the lower radio-frequency power supply 59. Therefore, the spatial distribution of ion density can be controlled in the radial direction, and the spatial characteristics of the reactive ion etching can be controlled arbitrarily and finely.

[Details of Sleeve 90]

Figure 2:
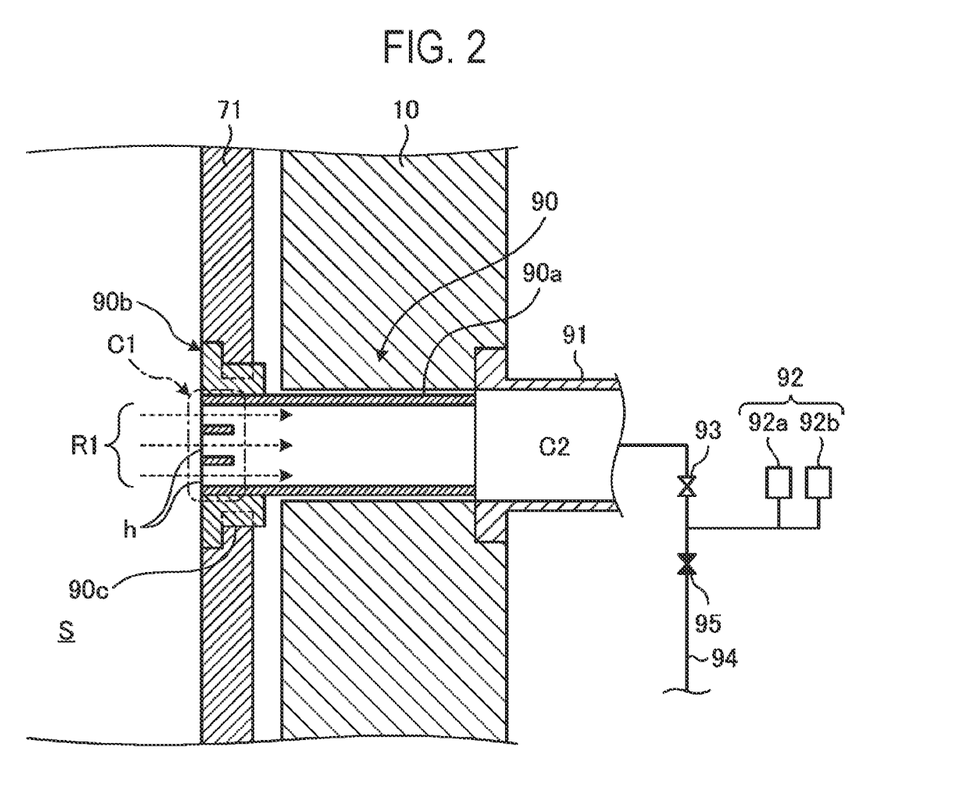
FIG. 2 is a partially enlarged view showing an example of a cross section around a sleeve according to the first embodiment.
Figure 3:
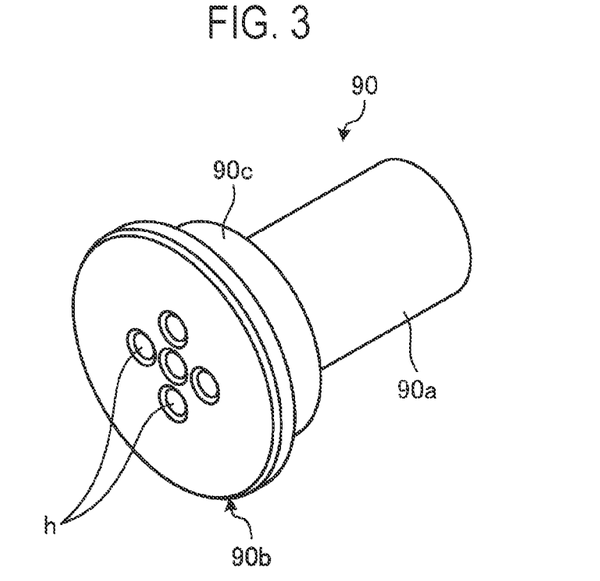
FIG. 3 is a diagram showing an example of gas introduction holes of the sleeve according to the first embodiment.

Next, the sleeve 90 will be described with reference to FIGS. 2 and 3. FIG. 2 is a partially enlarged view showing an example of a cross section around the sleeve according to the first embodiment. FIG. 3 is a diagram showing an example of gas introduction holes of the sleeve according to the first embodiment. As shown in FIGS. 2 and 3, the sleeve 90 includes a tubular portion 90a and a tip portion 90b. A stepped portion 90c is provided at the tip portion 90b, and is fitted to a stepped portion of the through-hole of the deposit shield 71. In addition, a plurality of gas holes his provided in the tip portion 90b, and the plasma generation space S and the inside of the pipe 91 communicate with each other via, the tubular portion 90a.

The gas supplied to the plasma generation space S flows into the pipe 91 through a path R1 via the plurality of gas holes h and the tubular portion 90a. The gas flowing into the pipe 91 reaches the capacitance manometer 92 via the valve 93. The valve 95 is kept closed when a process is performed in the plasma generation space S. Thus, the gas does not flow toward the pipe 94.

Comparing a conductance C1 of the plurality of gas holes h and a conductance C2 per unit length of the pipe 91 at the connection portion between the sleeve 90 and the pipe 91, the conductance C1 is lower than the conductance C2. That is, the pipe 91 has the plurality of gas holes h having the conductance C1 lower than the conductance C2 per unit length of the pipe 91 at a position where the pipe 91 is connected to the plasma generation space S of the chamber 10. One gas hole h may be formed as long as it has a desired conductance value. Further, a conductance of a path extending from the plasma generation space S toward the exhaust space F via the sleeve 90 and the pipes 91 and 94 is higher than a conductance of a path extending from the plasma generation space S toward the exhaust space E via the partition plate 50. That is, the pipe 94 serves as a bypass path for discharging the gas in the pipe 91 and the capacitance manometer 92 to the exhaust space E.

[Gas Switching Method in Substrate Processing]

Figure 4:
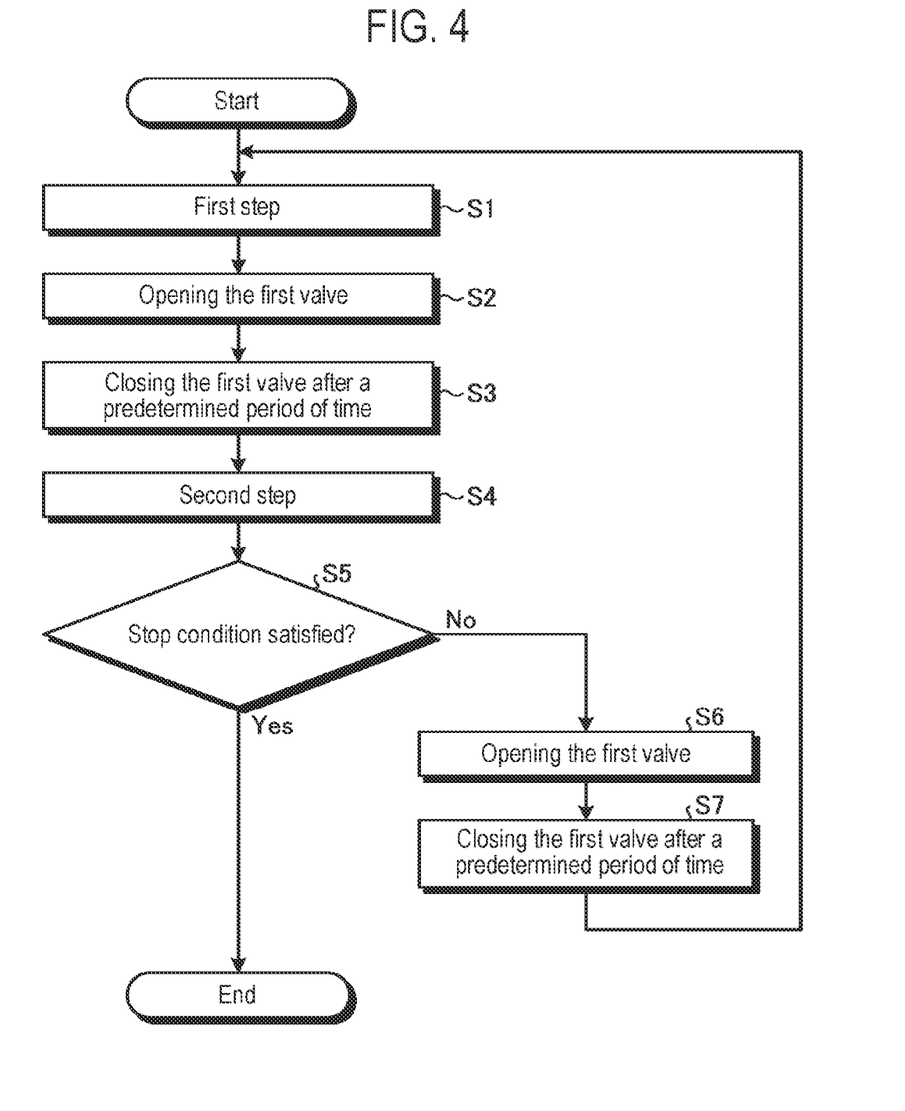
FIG. 4 is a flowchart showing an example of a substrate processing according to the first embodiment.

Next, a gas switching method performed in the vicinity of the capacitance manometer 92 will be described with reference to FIG. 4. FIG. 4 is a flowchart showing an example of a substrate processing according to the first embodiment.

First, the controller 5 loads the wafer W as a processing target into the chamber 10 with the gate valve 52 and the shutter kept in an open state, and places the wafer W on the susceptor 13. The controller 5 introduces a processing gas corresponding to a first processing condition of a first step from the processing gas source 38 into the plasma generation space S of the chamber 10.

The controller 5 executes the first step by setting the pressure of the plasma generation space S to a pressure of the first processing condition and supplying radio-frequency power to generate plasma (step S1). The first step includes, for example, a step of depositing an etchant for ALE.

When switching from the first step to a second step, the controller 5 switches the processing condition from the first processing condition to a second processing condition. That is, the controller 5 introduces a processing gas corresponding to the second processing condition of the second step from the processing gas source 38 into the plasma generation space S of the chamber 10. The controller 5 opens the valve 95, which is the first valve, when switching from the first processing condition to the second processing condition (step S2). After a predetermined period of time has elapsed after opening the valve 95, the controller 5 closes the valve 95, which is the first valve (step S3). The predetermined period of time is, for example, a time period required for switching the processing gas, and may be a period of time required for completing the replacement of the gas in the plasma generation space S. At this time, since the valve 95 is opened, the processing gas of the first processing condition, which remains inside the pipe 91 and the capacitance manometer 92, is pushed out by the processing gas of the second processing condition, and is exhausted to the exhaust space E through the pipe 94.

The controller 5 executes the second step by setting the pressure of the plasma generation space S to a pressure of the second processing condition and supplying radio-frequency power to generate plasma (step S4). The second step includes, for example, an activation step of ALE.

When the second step is completed, the controller 5 determines whether or not a stop condition of the substrate processing is satisfied (step S5). When the controller 5 determines that the stop condition is not satisfied (step S5: No), the controller 5 switches the processing condition from the second processing condition to the first processing condition in order to repeat the first step and the second step again. That is, the controller 5 introduces the processing gas corresponding to the first processing condition of the first step from the processing gas source 38 into the plasma generation space S of the chamber 10. The controller 5 opens the valve 95, which is the first valve, when switching from the second processing condition to the first processing condition (step S6). After a predetermined period of time has elapsed after opening the valve 95, the controller 5 closes the valve 95, which is the first valve (step S7), and the process returns to step S1. At this time, since the valve 95 is opened, the processing gas of the second processing condition, which remains inside the pipe 91 and the capacitance manometer 92, is pushed out by the processing gas of the first processing condition, and is exhausted to the exhaust space E through the pipe 94.

When the controller 5 determines that the stop condition is satisfied (step S5: Yes), the substrate processing is completed, and the wafer w is unloaded from the chamber 10 by opening the gate valve 52 and the shutter. As a result, the gas existing in the capacitance manometer 92 (measuring instrument) can be replaced at high speed. In addition, the pressure of the plasma generation space S carp be stabilized at high speed. Further, it is possible to suppress the occurrence of corrosion and deposit accumulation in the sleeve 90, the pipe 91 and the capacitance manometer 92. In addition, even when the conductance of the partition plate 50 is high, it is possible to achieve high-speed pressure equilibrium,

[Comparison of Gas Flow]

Figure 5:
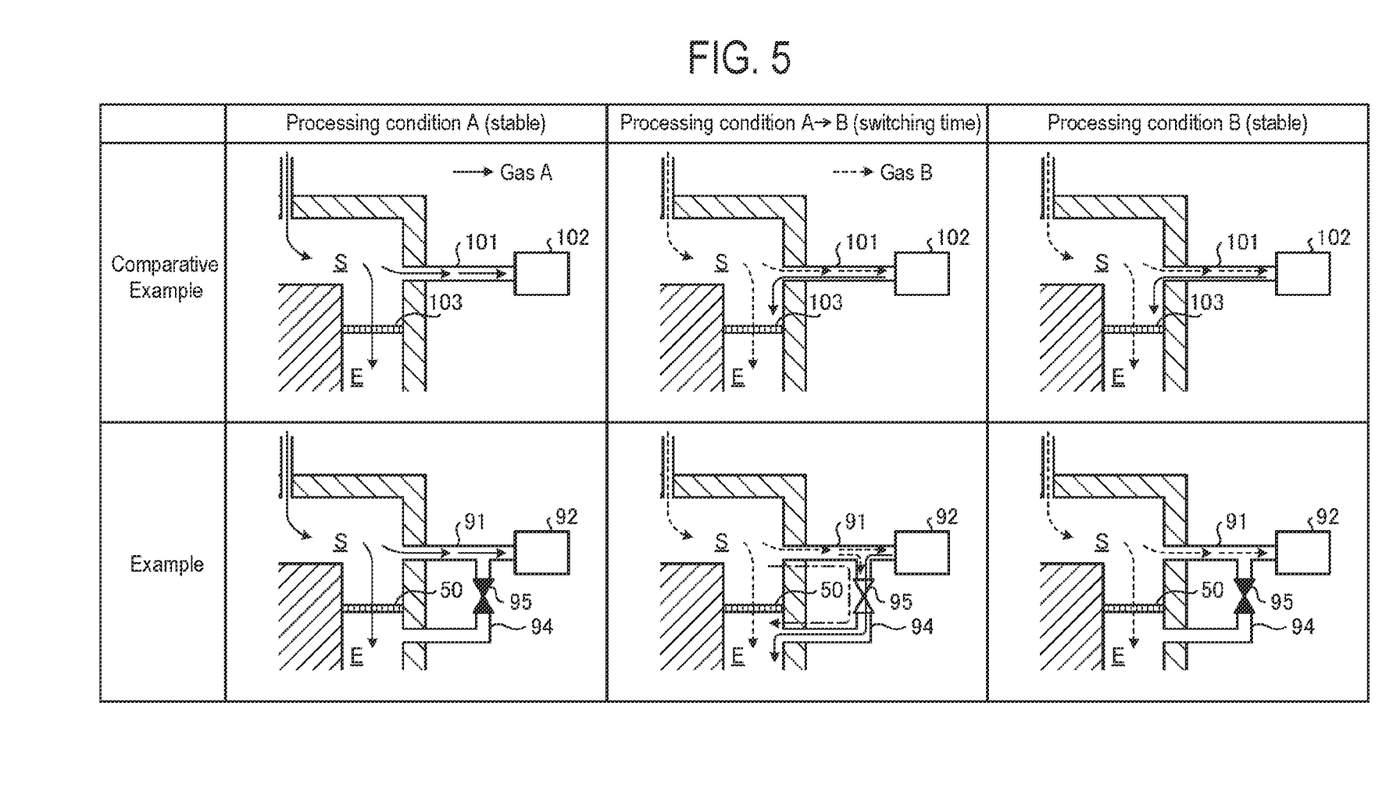
FIG. 5 is a diagram showing an example of a comparison of gas flows around a measuring instrument.

Next, gas flows around the measuring instrument will be described with reference to FIG. 5. FIG. 5 is a diagram showing an example of comparison of the gas flows around the measuring instrument. FIG. 5 shows a case in which a processing condition A using a gas A is set as a first processing condition, a processing condition B using a gas B is set as a second processing condition, and the gas A is switched to the gas B. Further, in the Comparative Example, a capacitance manometer 102 connected to the pipe 101 having a dead end is used as a pressure gauge. In the Example, a capacitance manometer 92 in which the pipe 94 is connected to the intermediate portion of the pipe 91 is used. In FIG. 5, the valve 93 is omitted.

First, when the processing condition A is stable, in the Comparative Example, the gas A flows from the plasma generation space S to the exhaust space E via the partition plate 103. At this time, the gas A reaches the capacitance manometer 102 via the pipe 101. In the Example, the gas A flows from the plasma generation space S to the exhaust space F via the partition plate 50. At this time, the gas A reaches the capacitance manometer 92 via the pipe 91. Since the valve 95 remains closed, the gas A does not flow through the pipe 94.

Subsequently, when switching from the processing condition A to the processing condition B, in the Comparative Example, the gas B flows from the plasma generation space S to the exhaust space E via the partition plate 103. At this time, the gas B pushes the gas A remaining in the pipe 101 into the pipe 101 and moves toward the capacitance manometer 102. The pushed gas A flows into the exhaust space E. In the Example, the gas B flows from the plasma generation space S to the exhaust space F via the partition plate 50. At this time, the valve 95 remains opened. Therefore, in the pipe 91, the gas A is discharged by the gas B into the exhaust space E through the valve 95 and the pipe 94. Further, a portion of the gas B is also discharged to the exhaust space E via the pipe 91, the valve 95 and the pipe 94 while pushing out the gas A. Since the gas A in the pipe 91 is quickly discharged, the gas B reaches the capacitance manometer 102 earlier than in the Comparative Example.

Thereafter, when the processing condition B is stable, in the Comparative Example, the gas B flows from the plasma generation space S to the exhaust space E via the partition plate 103. At this time, the gas B reaches the capacitance manometer 102 via the pipe 101. However, the gas A remaining in the pipe 101 flows backward through the pipe 101 and flows into the plasma generation space S and the exhaust space E. In the Example, the gas B flows from the plasma generation space S to the exhaust space E via the partition plate 50. At this time, the gas B reaches the capacitance manometer 92 via the pipe 91. Since the valve 95 remains closed, the gas B does not flow through the pipe 94. Inside the pipe 91 and the capacitance manometer 92, the gas A is discharged via the pipe 94 at the time of switching. Thus, the gas A does not remain inside the pipe 91 and the capacitance manometer 92. As described above, in the Example, the type of gas in the pressure gauge can be switched faster than in the Comparative Example.

[Followability to Pressure Change]

Figure 6:
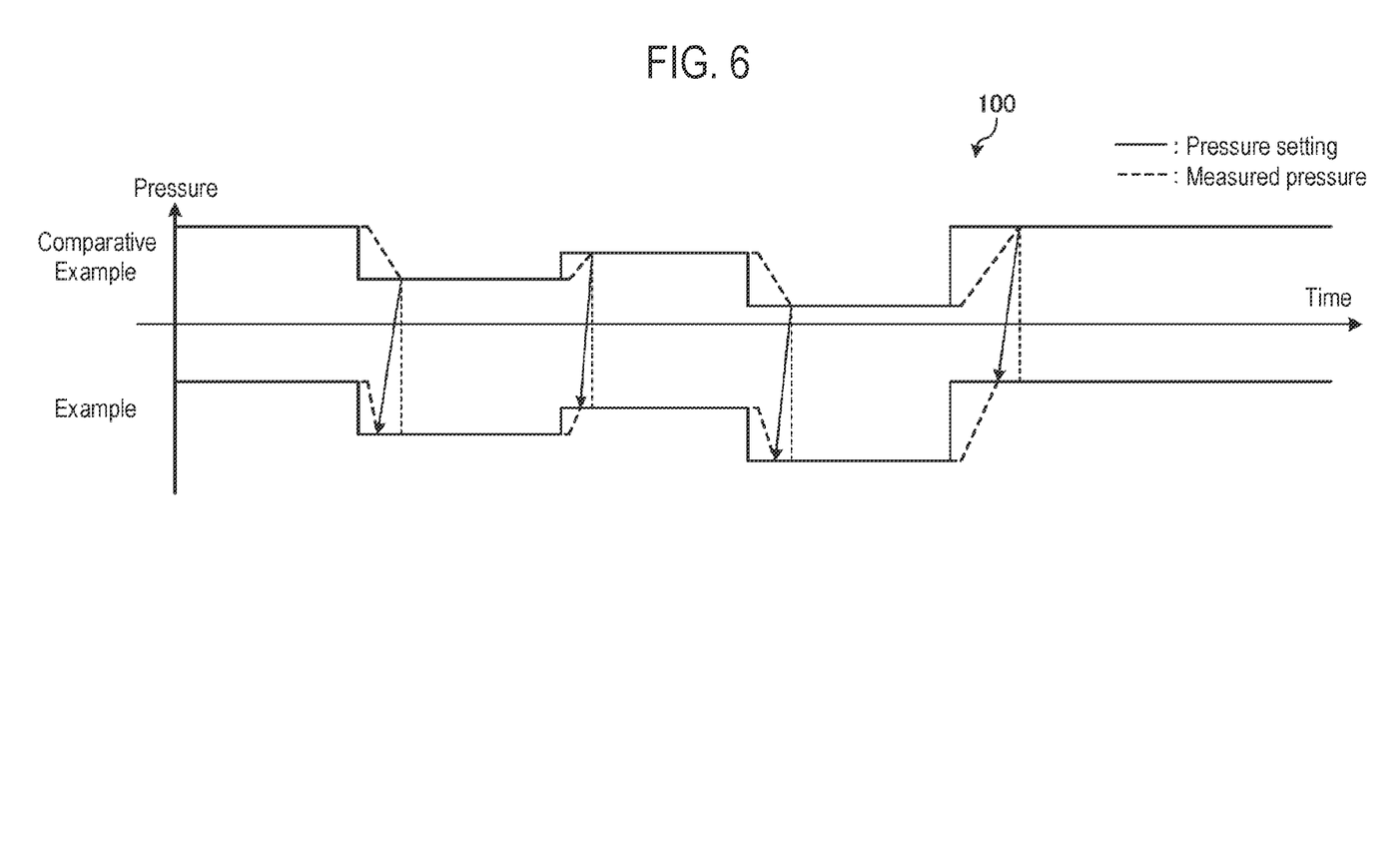
FIG. 6 is a diagram showing an example of a comparison regarding followability to pressure change.

Referring next to FIG. 6, the Example which indicates the followability to pressure change in the first embodiment will be compared with the Comparative Example which indicates a case in which the conventional pipe has a dead end and the conductance of the connection portion of the pipe with the chamber is lowered.

FIG. 6 is a diagram showing an example of comparison regarding the followability to pressure change. Graph 100 shown in FIG. 6 shows changes in the pressure setting of the plasma generation space S of the chamber 10 and the pressure measured by the pressure gauge in the Comparative Example and the Example.

Comparing the Comparative Example and the Example, in the fall of the pressure setting, the fall of the measured pressure is faster in the Example than in the Comparative Example. Further, even in the rise of the pressure setting, the rise of the measured pressure is faster in the Example than in the Comparative Example. In the Example, in the case of the rise of the pressure setting, the valve 95 is closed when the replacement of the processing gas is completed, thereby preventing the pressure from being released into the exhaust space E. That is, since the replacement of the processing gas is completed earlier than in the Comparative Example, the rise of the measured pressure is also accelerated accordingly. Since the followability to pressure change is improved as described above, it is possible to minimize the influence on the throughput in the substrate processing.

[Modification]

In the first embodiment described above, the pipe 94 is connected to the intermediate portion of the pipe 91. However, the pipe 94 may be connected to the capacitance manometer 92. The embodiment in this case will be described as Modification. Since the plasma processing apparatus of Modification is the same as the plasma processing apparatus 1 of the first embodiment described above, the description of configurations and operations that overlap with those of the first embodiment will be omitted.

Figure 7:
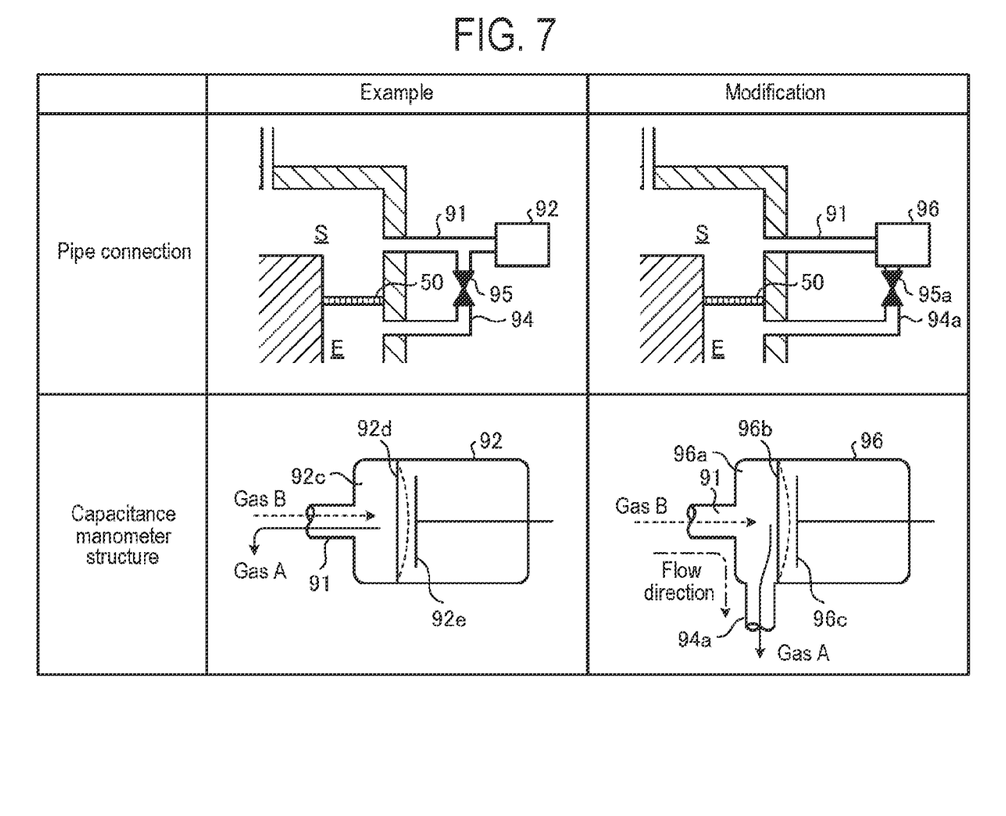
FIG. 7 is a diagram showing an example of a pipe fir a capacitance manometer in Modification.

FIG. 7 is a diagram showing an example of the pipe extending to the capacitance manometer in Modification. As shown in FIG. 7, in Modification, unlike the Example of the first embodiment, a capacitance manometer 96, a pipe 94*a* and a valve 95*a* are provided instead of the capacitance manometer 92, the pipe 94 and the valve 95. In FIG. 7, the valve 93 is omitted. In Modification, the pipe 94*a* is connected to the capacitance manometer 96 via the valve 95*a*.

Next, the structure of the capacitance manometer will be compared. First, the capacitance manometer 92 of the first embodiment includes a measurement chamber 92*c* communicating with the inside of the pipe 91, a diaphragm 92*d* and a fixed electrode 92*e*. The capacitance manometer 92 shown as the structure of the capacitance manometer in FIG. 7 corresponds to each of the capacitance manometers 92*a* and 92*b*. The capacitance manometer 92 detects a pressure as the gas is introduced from the pipe 91 into the measurement chamber 92*c*, a distance between the diaphragm 92*d* and the fixed electrode 92*e* is changed according to a pressure of the gas, and a capacitance between the diaphragm 92*d* and the fixed electrode 92*e* is changed. In the capacitance manometer 92, when the gas A is switched to the gas B, the gas B and the gas A pass through the same pipe 91. Therefore, it is difficult for the gas in the measurement chamber 92*c* to be replaced.

On the other hand, the capacitance manometer 96 of Modification includes a measurement chamber 96*a* in communication with the inside of the pipe 91 and the pipe 94*a*, a diaphragm 96*b* and a fixed electrode 96*c*. The capacitance manometer 96 detects a pressure as the gas is introduced from the pipe 91 into the measurement chamber 96*a*, a distance between the diaphragm 96*b* and the fixed electrode 96*c* is changed according to a pressure of the gas, and a capacitance between the diaphragm 96*b* and the fixed electrode 96*c* is changed. In the capacitance manometer 96, when the gas A is switched to the gas B, the gas B is introduced from the pipe 91 into the measurement chamber 96*a*, and the gas A in the measurement chamber 96*a* is discharged from the pipe 94*a*. Therefore, the gas in the measurement chamber 96*a* can be replaced quickly. As a result, the gas in the capacitance manometer 96 can be replaced at a higher speed than the gas in the capacitance manometer 92.

Second Embodiment

Figure 8:
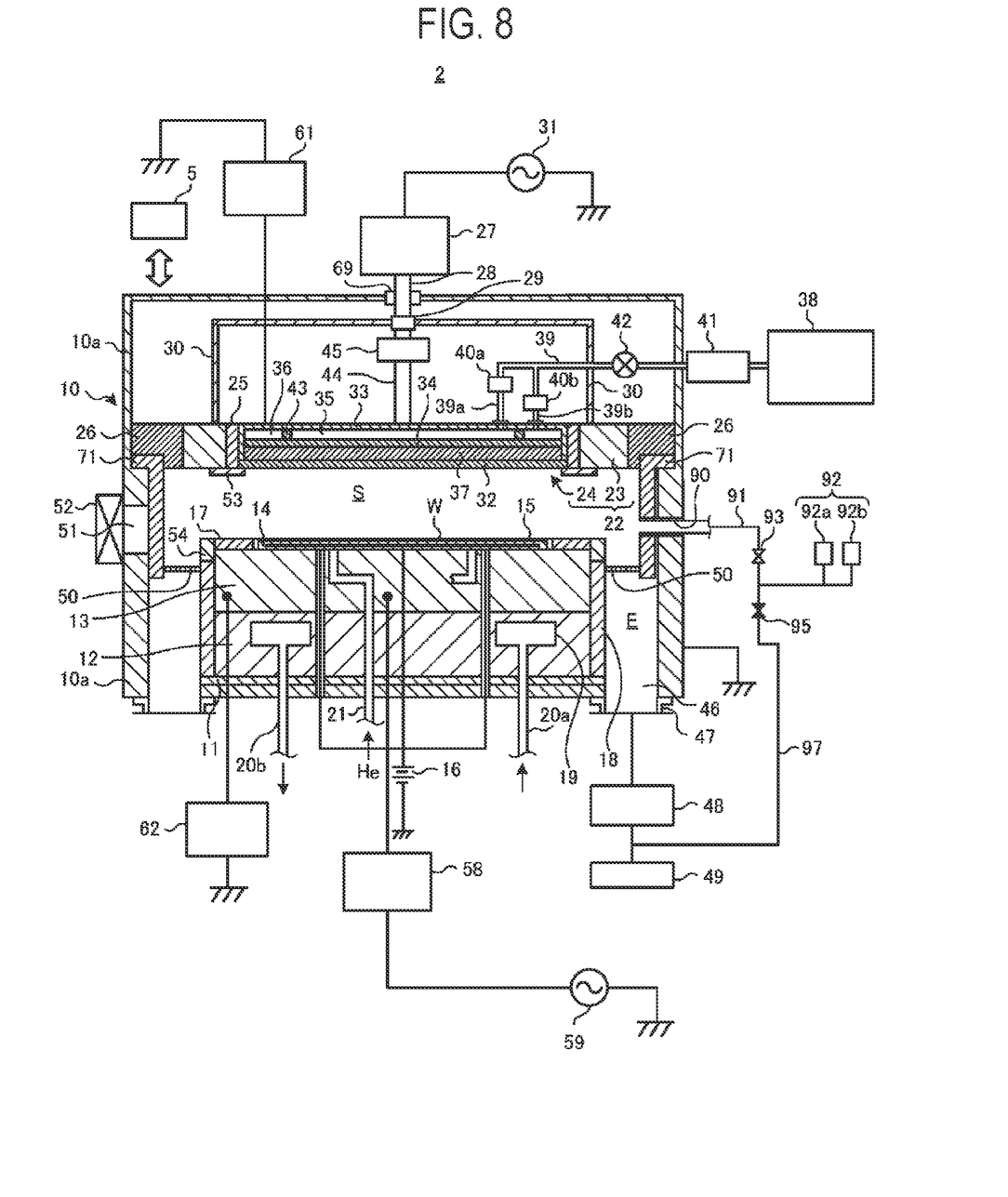
FIG. 8 is a diagram showing an example of a substrate processing apparatus according to a second embodiment.

In the first embodiment described above, the pipe 94 is connected to the exhaust space E of the chamber 10. However, the pipe 94 may be connected between the APC valve 48 and the TMP 49. The embodiment in this case will be described as a second embodiment. The same configurations as those in the first embodiment will be designed by like reference numerals, and the description of configurations and operations that overlap with those in the first embodiment will be omitted.

FIG. 8 is a diagram showing an example of a substrate processing apparatus according to the second embodiment. Unlike the plasma processing apparatus 1 of the first embodiment, a plasma processing apparatus 2 which is an example of the substrate processing apparatus shown in FIG. 8 includes a pipe 97 instead of the pipe 94.

The pipe 97 connects the pipe, which connects the APC valve 48 and the TMP 49, and the capacitance manometer 92, via the valve 95. The pipe 97 is an example of a second pipe. One end of the pipe 97 is connected to an intermediate portion between the valve 93 of the pipe 91 and the capacitance manometer 92. That is, the pipe 97 is a pipe that brings the side of the exhaust space E (exhaust chamber) of the TMP49, which is an exhaust pump, and the capacitance manometer 92 (measuring instrument) into communication with each other via the valve 95, which is a first valve. By connecting the pipe 97 directly to the TMP 49 in this way, the gas in the pipe 91 and the capacitance manometer 92 can be replaced at a higher speed.

As described above, according to the first embodiment, the substrate processing apparatus (plasma processing apparatus 1) includes the processing chamber (plasma generation space S), the exhaust chamber (exhaust space E), the partition plate 50, the measuring instrument (capacitance manometer 92), the first pipe (pipe 91), the second pipe (pipe 94), and the controller 5. The processing chamber executes the processing on the substrate by the introduced gas. The exhaust chamber exhausts the gas in the processing chamber. The partition plate 50 has the plurality of gas passing holes through which the processing chamber and the exhaust chamber are in communication with each other. The measuring instrument measures the state in the processing chamber. The first pipe connects the processing chamber and the measuring instrument. The second pipe brings the exhaust chamber and the measuring instrument into communication with each other via the first valve (valve 95). The controller 5 controls the first valve. As a result, the gas existing in the measuring instrument can be replaced at a high speed.

Further, according to the first embodiment, the controller 5 opens the first valve when switching from the first processing condition to the second processing condition. As a result, the gas existing in the measuring instrument can be replaced at a high speed in response to the change in the processing condition.

Further, according to the first embodiment, after a predetermined period of time from the opening of the first valve, the controller 5 closes the first valve. As a result, the internal pressure of the processing chamber can be quickly adjusted to a desired pressure in a subsequent step.

Further, according to the first embodiment, one end of the second pipe is connected to the intermediate portion of the first pipe. As a result, the gas existing in the measuring instrument can be replaced at a high speed.

Further, according to the first embodiment, the first pipe has the second valve (valve 93) provided between the intermediate portion to which one end of the second pipe is connected and the processing chamber. As a result, it is possible to protect the measuring instrument (capacitance manometer 92) when the chamber 10 is exposed to the atmosphere.

Further, according to Modification, one end of the second pipe is connected to the measuring instrument (capacitance manometer 96) at a location different from the location where the first pipe is connected to the measuring instrument. As a result, the gas existing in the measuring instrument (capacitance manometer 96) can be replaced at a higher speed than that inside the measuring instrument (capacitance manometer 92) to which the pipe is connected at one location.

Further, according to Modification, the second pipe and the first pipe communicate with each other inside the measuring instrument. As a result, the gas existing in the measuring instrument (capacitance manometer 96) can be replaced at a higher speed than that inside the measuring instrument (capacitance manometer 92) to which the pipe is connected at one location.

Further, according to each of the embodiments, the first pipe has one or more holes having a conductance value lower than the conductance value per unit length of the first pipe at a location where the first pipe is connected to the processing chamber. As a result, it is possible to prevent the gas from flowing backward from the pipe 91 to the processing chamber.

Further, according to each of the embodiments, the measuring instrument is a pressure gauge. As a result, the internal pressure of the processing chamber can be measured.

Further, according to each of the embodiments, the partition plate 50 is an exhaust ring. As a result, it is possible to prevent plasma from leaking from the processing chamber, which is the plasma generation space S, to the exhaust space E and the exhaust port 46.

Further, according to each of the embodiments, plasma is generated in the processing chamber. As a result, the gas existing in the plasma generation space S can be measured.

Further, according to the second embodiment, the substrate processing apparatus (plasma processing apparatus 2) includes the processing chamber (plasma generation space S), the exhaust chamber (exhaust space E), the vacuum pump (TMP 49), the partition plate 50, the measuring instrument (capacitance manometer 92), the first pipe (pipe 91), the second pipe (pipe 97), and the controller 5. The processing chamber executes the processing on the substrate by the introduced gas. The exhaust chamber exhausts the gas existing in the processing chamber. The vacuum pump evacuates the exhaust chamber. The partition plate 50 has the plurality of gas passing holes through which the processing chamber and the exhaust chamber are in communication with each other. The measuring instrument measures the state in the processing chamber. The first pipe connects the processing chamber and the measuring instrument. The second pipe brings the side of the exhaust chamber of the vacuum pump and the measuring instrument into communication with each other via the first valve (valve 95). The controller controls the first valve. As a result, the gas existing in the measuring instrument can be replaced at a higher speed.

It should be noted that the embodiments and modifications disclosed herein are exemplary in all respects and are not restrictive. The above-described embodiments and modifications may be omitted, replaced or modified in various forms without departing from the scope and spirit of the appended claims.

Further, in each of the above-described embodiments, the plasma processing apparatuses 1 and 2 have been described as an example of the substrate processing apparatus. However, the present disclosure is not limited thereto. For example, the present disclosure may be applied to a case of measuring an internal state, for example, an internal pressure of various types of devices subjected to evacuation, for example, a transfer device.

Further, in each of the above-described embodiments, the sleeve 90 is fitted into the through-hole provided in the deposit shield 71. However, the present disclosure is not limited thereto. For example, the sleeve may be configured to be drivable in the horizontal direction and may be connected at one end to the deposit shield that can be driven in the vertical direction, thereby bringing the plasma generation space S and the pipe 91 into communication with each other.

According to the present disclosure in some embodiments, it is possible to replace a gas existing in a measuring instrument at a high speed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    a processing chamber configured to execute a processing on a substrate by an introduced gas;
    an exhaust chamber configured to exhaust a gas existing in the processing chamber;
    a partition plate having a plurality of gas passing holes for bringing the processing chamber and the exhaust chamber into communication with each other therethrough;
    a measuring instrument configured to measure a state in the processing chamber;
    a first pipe configured to connect the processing chamber and the measuring instrument;
    a second pipe configured to bring the exhaust chamber and the measuring instrument into communication with each other therethrough via a first valve; and
    a controller,
    wherein the controller is configured to control the substrate processing apparatus to open the first valve to discharge a first gas into the exhaust chamber through the second pipe while allowing a second gas to reach the measuring instrument through the first pipe, when switching from a first processing condition to a second processing condition, and
    wherein the first gas is different from the second gas.

2. The substrate processing apparatus of claim 1, wherein the controller is configured to control the substrate processing apparatus so as to close the first valve after a predetermined period of time has elapsed since the first valve is opened.

3. The substrate processing apparatus of claim 2, wherein one end of the second pipe is connected to an intermediate portion of the first pipe.

4. The substrate processing apparatus of claim 3, wherein the first pipe has a second valve provided between the intermediate portion to which the one end of the second pipe is connected and the processing chamber.

5. The substrate processing apparatus of claim 4, wherein the first pipe has one or more holes having a conductance value lower than a conductance value per unit length of the first pipe at a location where the first pipe is connected to the processing chamber.

6. The substrate processing apparatus of claim 5, wherein the measuring instrument is a pressure gauge.

7. The substrate processing apparatus of claim 6, wherein the partition plate is an exhaust ring.

8. The substrate processing apparatus of claim 7, wherein a plasma is generated in the processing chamber.

9. The substrate processing apparatus of claim 1, wherein one end of the second pipe is connected to an intermediate portion of the first pipe.

10. The substrate processing apparatus of claim 1, wherein one end of the second pipe is connected to the measuring instrument at a location different from a location where the first pipe is connected to the measuring instrument.

11. The substrate processing apparatus of claim 10, wherein the second pipe and the first pipe communicate with each other inside the measuring instrument.

12. The substrate processing apparatus of claim 1, wherein the first pipe has one or more holes having a conductance value lower than a conductance value per unit length of the first pipe at a location where the first pipe is connected to the processing chamber.

13. The substrate processing apparatus of claim 1, wherein the measuring instrument is a pressure gauge.

14. The substrate processing apparatus of claim 1, wherein the partition plate is an exhaust ring.

15. The substrate processing apparatus of claim 1, wherein a plasma is generated in the processing chamber.

16. A substrate processing apparatus, comprising:
    a processing chamber configured to execute a processing on a substrate by an introduced gas;
    an exhaust chamber configured to exhaust a gas existing in the processing chamber;
    a vacuum pump configured to evacuate the exhaust chamber;
    a partition plate having a plurality of gas passing holes for bringing the processing chamber and the exhaust chamber into communication with each other therethrough;
    a measuring instrument configured to measure a state in the processing chamber;
    a first pipe configured to connect the processing chamber and the measuring instrument;
    a second pipe configured to bring the exhaust chamber of the vacuum pump and the measuring instrument into communication with each other therethrough via a first valve; and
    a controller,
    wherein the controller is configured to control the substrate processing apparatus to open the first valve to discharge a first gas into the exhaust chamber through the second pipe while allowing a second gas to reach the measuring instrument through the first pipe, when switching from a first processing condition to a second processing condition, and
    wherein the first gas is different from the second gas.

* * * * *